US009726705B2

(12) United States Patent
Poisson et al.

(10) Patent No.: US 9,726,705 B2
(45) Date of Patent: Aug. 8, 2017

(54) SENSOR INTERFACE CIRCUITS

(71) Applicants: Hamilton Sundstrand Corporation, Charlotte, NC (US); Simmonds Precision Products, Inc., Vergennes, VT (US)

(72) Inventors: Richard A. Poisson, Avon, CT (US); Scott R. Durkee, New Haven, VT (US); Gary L. Hess, Enfield, CT (US); Michael Abbott, Shelburne, VT (US)

(73) Assignees: Hamilton Sundstrand Corporation, Charlotte, NC (US); Simmonds Precision Products, Inc., Vergennes, VT (US)

( * ) Notice: Subject to any disclaimer, the term of this patent is extended or adjusted under 35 U.S.C. 154(b) by 250 days.

(21) Appl. No.: 14/457,954

(22) Filed: Aug. 12, 2014

(65) Prior Publication Data
US 2016/0047852 A1    Feb. 18, 2016

(51) Int. Cl.
*G01R 31/02*    (2006.01)
*G01R 17/12*    (2006.01)

(52) U.S. Cl.
CPC ........... *G01R 31/025* (2013.01); *G01R 17/12* (2013.01)

(58) Field of Classification Search
CPC ....... G01R 17/12; G01R 31/02; G01L 1/2268; H03M 1/60; H03M 1/06; G01B 7/00; H03H 7/00; H03K 5/00; H03K 3/02; H03K 3/00; G01G 19/00; G01G 23/18; G01G 19/44; G01G 23/37
See application file for complete search history.

(56) References Cited

U.S. PATENT DOCUMENTS 3,960,010 A      6/1976  Gustafsson
2009/0207064 A1*  8/2009  Feldotte .............. H03M 1/0607
                                                  341/155

FOREIGN PATENT DOCUMENTS

GB          2165647 A     4/1986
GB          2196131 A     4/1988
WO    WO-2014094777 A1    6/2014

OTHER PUBLICATIONS

Extended European Search Report Application No. 15179981.4-1568 dated Jan. 12, 2016.

* cited by examiner

*Primary Examiner* — Son Le
(74) *Attorney, Agent, or Firm* — Locke Lord LLP; Scott D. Wofsy; Christopher J. Cillié

(57) ABSTRACT

An interface circuit for a bridge sensor has a switch that connects to a resistive bridge circuit. The resistive bridge circuit includes a first input terminal, a second input terminal, and a pair of resistive branches that connect between the first and second input terminals. Both of the resistive branches include an output terminal. The switch is connected to the first input terminal and is in series with both resistive branches for connecting and disconnecting a voltage source from the resistive branch output terminals.

9 Claims, 4 Drawing Sheets

SENSOR INTERFACE CIRCUITS

BACKGROUND OF THE INVENTION

1. Field of the Invention

The present disclosure relates to measurement systems, and more particularly to measurement systems employing bridge circuits.

2. Description of Related Art

A bridge circuit generally includes resistors arranged in two parallel branches between voltage terminals. Each branch generally includes two resistors arranged in series, an intermediate terminal disposed between the resistors, and a 'bridging' branch connecting the intermediate terminals. Typically, one resistor in each parallel branch has a known resistance, a third resistor in one parallel branch has an adjustable variable resistance, and a fourth resistor in the other parallel branch has unknown resistance. By adjusting the variable resistance of the third resistor such that no current flows through the 'bridging' branch the unknown resistance of the fourth resistor can be determined. This is because the ratio of the fixed resistance of the first resistor and the variable resistance of the third resistor is the same as a ratio of the fixed resistance of the second resistor and the unknown resistance of the fourth when no current flows through the 'bridging' branch. By arranging the fourth resistor such that its resistance varies with a parameter of interest, the parameter can be measured by determining the resistance of the fourth resistor.

One challenge to sensors incorporating such bridge circuits is the influence of unrelated factors on the measured resistance. For example, some bridge circuits can be susceptible to high impedance leakage due to the common mode voltage created at the intermediate terminals. Since the circuit output is not typically a low impedance source, high impedance leakage can cause output changes that can be confused with resistance change due to change in the parameter of interest.

Such conventional systems and methods have generally been considered satisfactory for their intended purpose. However, there is still a need in the art for improved sensor interface circuits. The present disclosure provides a solution for this need.

SUMMARY OF THE INVENTION

A sensor circuit has a switch that connects to a resistive bridge circuit. The resistive bridge circuit includes a first input terminal, a second input terminal, and a pair of resistive branches that connect between the first and second input terminals. Both the resistive branches include an output terminal. The switch is connected to the first input terminal and is connected electrically in series with the resistive branches for connecting and disconnecting a voltage source from the resistive branch output terminals.

In certain embodiments, an input lead can be connected between the switch and the first input terminal. A second input lead can be connected between a second switch and the second input terminal. A second voltage source can be connected to the second input terminal through the second switch. It is contemplated that the first and second switches can include mechanical switches, relays, or solid-state devices like transistors.

In accordance with certain embodiments, the resistive branches can include two resistors electrically connected in series and with the respective output terminal disposed between the resistors. A first output lead can be connected to a first of the output terminals. A second output lead can be connected to a second of the output terminals. The first and second output leads can have measurement terminals disposed on ends opposite the output terminals. A voltage differential measurement module can be connected to the output lead measurement terminals. The voltage differential measurement module can be configured and adapted for acquiring differential voltage measurements at the measurement terminals when either or both of the switches are closed, i.e. when either or both of the voltage sources are connected to the bridge circuit.

It is contemplated that in certain embodiments a cable can include at least one of the output leads and input leads. The cable can include a current leakage path at a location along a length of the lead. A measurement system can include the first switch, the second switch, and the voltage differential measurement module. The measurement system can be configured and adapted for connecting either or both of the voltage sources to the sensor circuit through the cable, determining differential voltage between the measurement terminals of output leads, and calculating magnitude and/or location of the current leakage path within at least one of the input leads and output leads using the determined differential voltage.

A method of detecting current leakage within a sensor interface circuit includes connecting a first voltage source to a first input terminal of a bridge sensor, determining voltage at a first measurement terminal of a first output lead connected to a first resistive branch of the bridge sensor, determining voltage at a second measurement terminal of a second output lead connected to a second resistive branch of the bridge sensor, and calculating a first differential between the determined voltages.

In certain embodiments, method can include quantifying leakage current flow from one of the first and second output leads using the calculated voltage differential. The method can include determining a location of the leakage current flow from one of the first and second output leads using the first differential voltage. Connecting the first voltage source to the first input terminal can include closing a first switch connected between the first voltage source and the first input terminal.

In accordance with certain embodiments, the method can include connecting a second voltage source to a second input terminal of the bridge sensor, determining again voltages at the first and second measurement terminals, calculating a second differential between the determined voltages, and quantifying leakage current from an input lead connecting the second voltage source to the bridge sensor second input terminal. Connecting the second voltage source to the second input terminal can include closing a second switch connected between the second voltage source and the second input terminal of the bridge sensor. It is also contemplated that the method can include disconnecting the first voltage source and quantifying leakage current from an input lead connected between the first switch and the first input terminal.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the systems and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
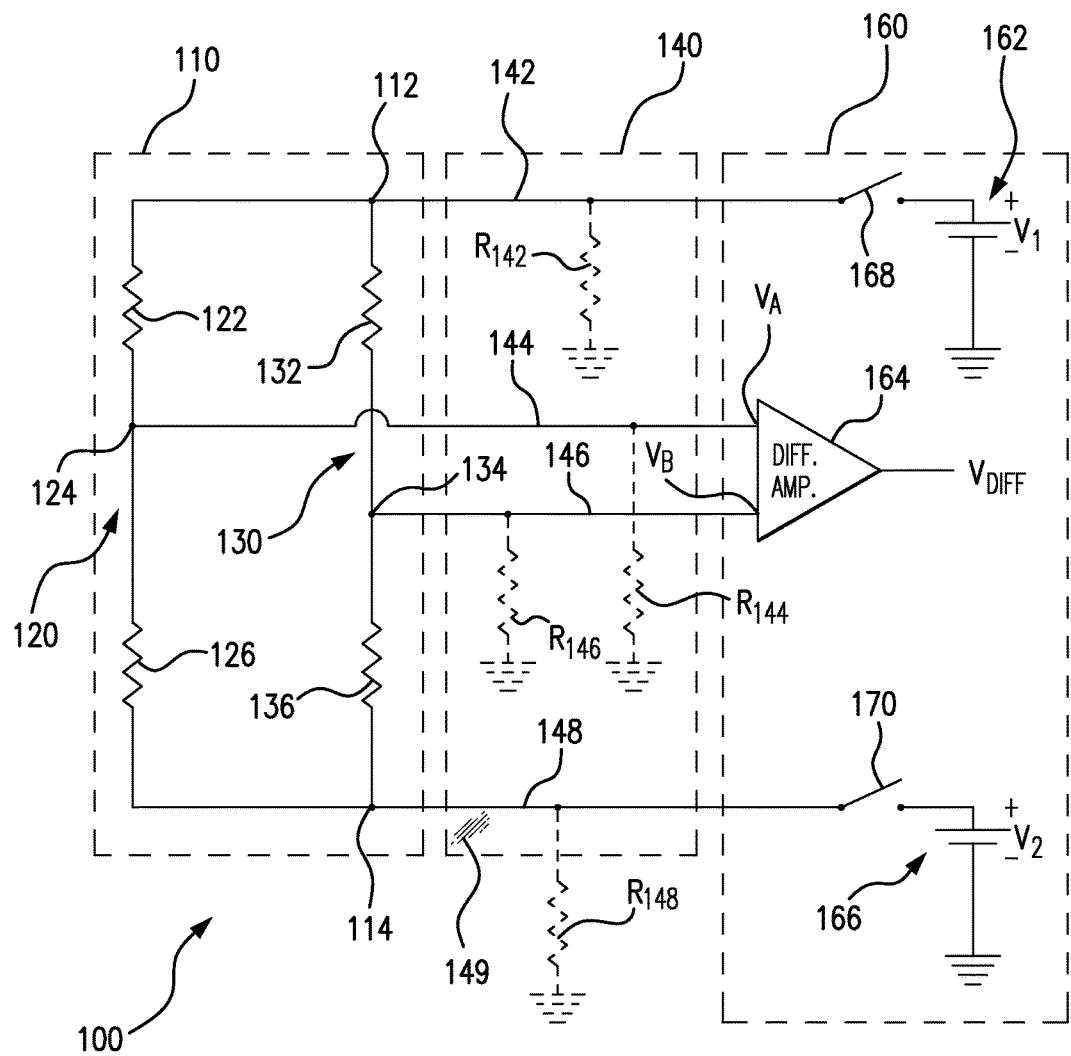
FIG. 1 is a circuit diagram of a sensor interface circuit constructed in accordance with the present disclosure, showing a bridge sensor, a cable, and a measurement system.

Reference will now be made to the drawings wherein like reference numerals identify similar structural features or aspects of the subject disclosure. For purposes of explanation and illustration, and not limitation, a partial view of an exemplary embodiment of a sensor interface circuit in accordance with the disclosure is shown in FIG. 1, and is designated generally by reference character 100. Other embodiments of sensor interface circuits in accordance with the disclosure, or aspects thereof, are provided in FIGS. 2-4, as will be described. The systems and methods described herein can be used aerospace and automotive applications detecting current leakage in sensor interface circuits for measuring load, strain, or temperature by way of non-limiting example.

With reference to FIG. 1, sensor interface circuit 100 includes a bridge sensor 110 (shown in dashed outline), a cable 140 (shown in dashed outline), and a measurement system 160 (shown in dashed outline). Cable 140 is connected between bridge sensor 110 and measurement system 160. It is to be understood that bridge sensor 110, cable 140, and measurement system 160 can be separate assemblies connected together for purposes of acquiring measurements of a parameter of interest. In embodiments, bridge sensor 110 includes precision resistors configured and adapted for measuring the parameter of interest in an aircraft system, cable 140 is a cable assembly such as a wiring harness, and measurement system 160 is control circuitry for aircraft electronics configured and adapted acquire measurements of the parameter of interest using bridge sensor 110.

Bridge sensor 110 is a resistive bridge sensor having a Wheatstone bridge arrangement. Bridge sensor 110 includes a first resistive branch 120, a second resistive branch 130, a first input terminal 112, and a second input terminal 114. First resistive branch 120 and second resistive branch 130 are connected between first input terminal 112 and second input terminal 114 such that first resistive branch 120 and second resistive branch 130 are electrically in parallel with one another.

First resistive branch 120 includes a first resistor 122, a first output terminal 124, and a second resistor 126. First resistor 122 is connected between first input terminal 112 and first output terminal 124. Second resistor 126 is connected between first output terminal 124 and second input terminal 114 such that first resistor 122 and second resistor 126 are electrically connected in series between first input terminal 112 and second input terminal 114.

Second resistive branch 130 is similar to first resistive branch 120 insofar as second resistive branch 130 includes a third resistor 132, a second output terminal 134, and a fourth resistor 136. Third resistor 132 is connected between first input terminal 112 and second output terminal 134. Fourth resistor 136 is connected second output terminal 134 and second input terminal 114 such that third resistor 132 and fourth resistor 136 are connected electrically in series with one another between first input terminal 112 and second input terminal 114. At least one of the resistors of bridge sensor 110, e.g. first resistor 122, second resistor 126, third resistor 132, and fourth resistor 136, is a variable resistor having resistance that is changeable in response to change in a parameter of interest, such load, strain, or temperature by way of non-limiting example.

In embodiments, at least one of first resistor 122, second resistor 126, third resistor 132, and fourth resistor 136 has variable resistance that varies with a parameter of interest. The remaining resistors have fixed resistance. In certain embodiments, e.g. in pressure sensor circuits, each of first resistor 122, second resistor 126, third resistor 132, and fourth resistor 136 has variable resistance that varies with a parameter of interest.

Cable 140 includes four leads coupled between bridge sensor 110 and measurement system 160. Cable 140 includes a first input lead 142, a second input lead 148, a first output lead 144, and a second output lead 146 each with opposed sensor and measurement system ends. First input lead 142 is connected to first input terminal 112 on its sensor end. Second input lead 148 is connected to second input terminal 114 on its sensor end. First output lead 144 is connected to first output terminal 124 on its sensor end. Second output lead 146 is connected to second output terminal 134 on its sensor end.

Measurement system 160 includes a first voltage source 162, a voltage differential measurement module 164, and a second voltage source 166. First voltage source 162 is connected to first input terminal 112 through first input lead 142. Second voltage source 166 is connected to second input terminal 114 through second input lead 148. Differential voltage measurement module 164 is connected to first output terminal 124 and second output terminal 134 through first output lead 144 and second output lead 146, respectively. In embodiments, differential voltage measurement module 164 includes a differential amplifier or comparator circuitry configured adapted to output a voltage differential between voltages observed between measurement ends of first output lead 144 and second output lead 146, i.e. at ends opposite first output terminal 124 and second output terminal 134. Differential voltage measurements can be obtained by (a) acquiring a first single-ended voltage measurement between the end of first output lead 144 and ground 10, (b) acquiring a second single-ended voltage measurement between the end of second output lead 146 and ground 10, and (c) determining a voltage differential by subtracting the first single-ended measurement from the second single-ended measurement. It is contemplated that the determination is made using software resident on a memory communicative with a processor operatively associated with measurement system 160.

Cable 140 includes electrical insulation 149. Some cable insulation materials can break down in the presence of substances like water, hydraulic fluid, deicing fluid, or fuel, thereby developing a current leakage path from conductors disposed within the cable. Such current leakage paths can result in stray or spurious signals being emitted by the cable into aircraft structure, potentially reducing reliability. For purposes of illustration, FIG. 1 shows leakages paths from each lead within lead of cable 140, a first input lead current leakage path $R_{142}$ extending from first input lead 142 to a ground terminal (illustrated in dashed lines), a second input lead current leakage path $R_{148}$ extending from second input lead 148 to a ground terminal (illustrated in dashed lines), a first output lead current leakage path $R_{144}$ extending from first output lead 144 to a ground terminal (illustrated in dashed lines), and a second output lead current leakage path $R_{146}$ extending from second output lead 146 to a ground potential terminal (illustrated in dashed lines). It is to be appreciated and understood that any or combination of leads within cable 140 can include a current leakage path between the lead and a ground terminal. It is also to be understood that the resistance of such leakage path is on order of many kilo Ohms to several mega Ohms.

Measurement system 160 also includes a first switch 168 and a second switch 170. First switch 168 is connected between a first voltage source 162 and first input lead 142 and is configured and adapted for electrically connecting and disconnecting first voltage source 162 from first input terminal 112. Second switch 170 is connected between a second voltage source 166 and second input lead 148 and is configured and adapted for electrically connecting and disconnecting second voltage source 166 from second input terminal 114. First switch 168 and second switch 170 can be mechanical switches or relays. In certain embodiments, first switch 168 and second switch 170 are solid-state devices such as MOSFETs or IGBTs that are operatively associated with a controller communicative with a memory having instructions recorded thereon to electrically open and close the switches in accordance with the below-described method.

Figure 2:
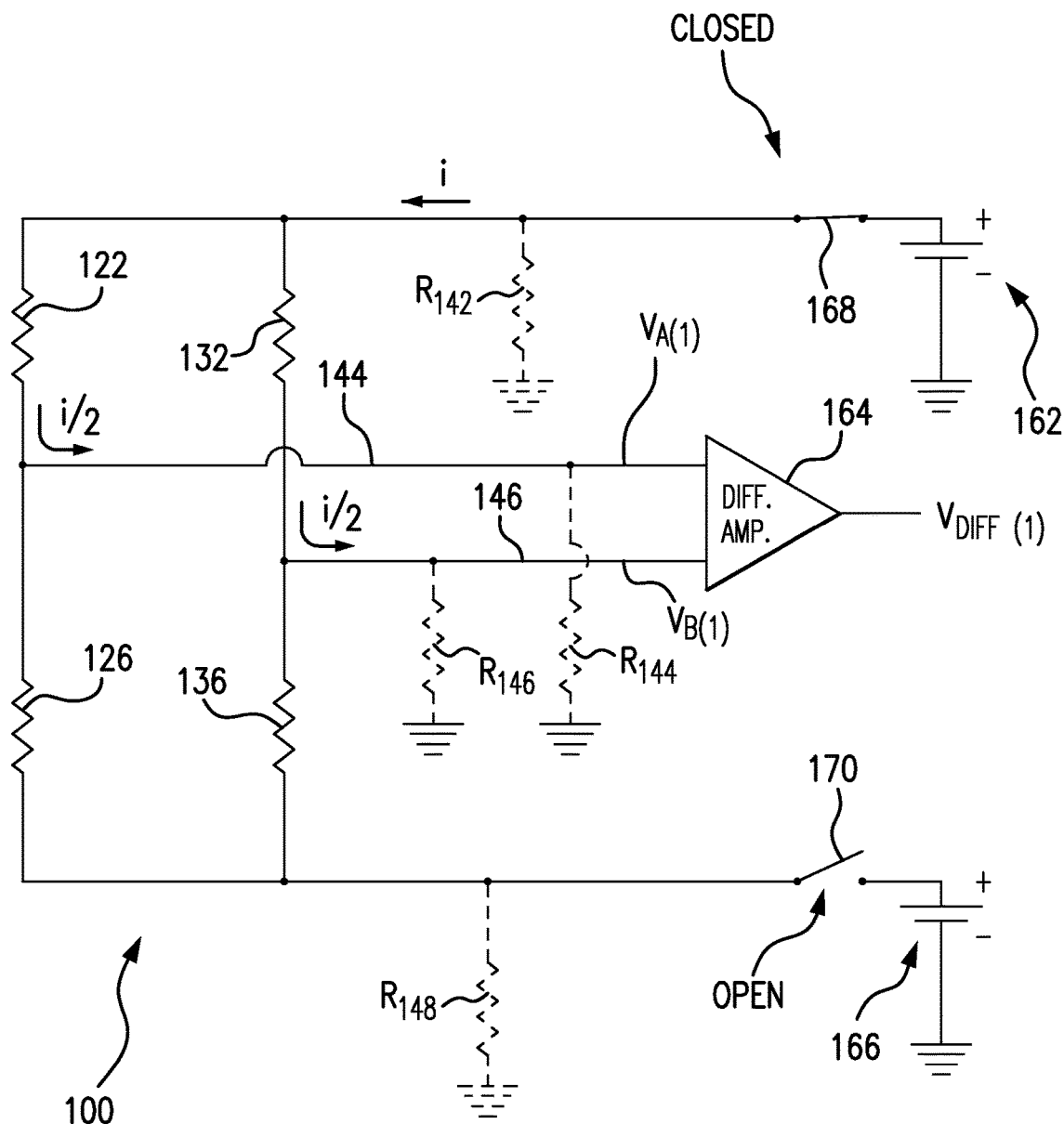
FIG. 2 is a circuit diagram of the sensor interface circuit of FIG. 1, showing the circuit in a first configuration wherein a first voltage source is connected to the bridge sensor.

With reference to FIG. 2, sensor interface circuit 100 is shown in a first configuration. In the first configuration, first switch 168 is electrically closed and second switch 170 is electrically open position. This causes current to flow through first input lead 142, first resistor 122, third resistor 132, first output lead 144, and second output lead 146. When first output lead current leakage path $R_{144}$ and second output lead current leakage path $R_{146}$ are zero or equivalent to one another, voltage $V_{A(1)}$ and $V_{B(1)}$ will be equivalent, and a differential voltage measurement $V_{Diff(1)}$ reported by differential voltage measurement module 164 will be zero.

In the event that first output lead current leakage path $R_{144}$ and second output lead current leakage path $R_{146}$ are unequal to one another, voltage $V_{A(1)}$ and $V_{B(1)}$ will be unequal. This will cause differential voltage measurement $V_{Diff(1)}$ reported by differential voltage measurement module 164 to be non-zero. The magnitude of the leakage current will be indicated by the magnitude of differential voltage measurement $V_{Diff(1)}$. Location of the current leakage, e.g. whether current leakage from one of first output lead 144 and second output lead 146 is greater than the other of the first output lead 144 and second output lead 146, will be indicated by the polarity of differential voltage measurement $V_{Diff(1)}$.

Figure 3:
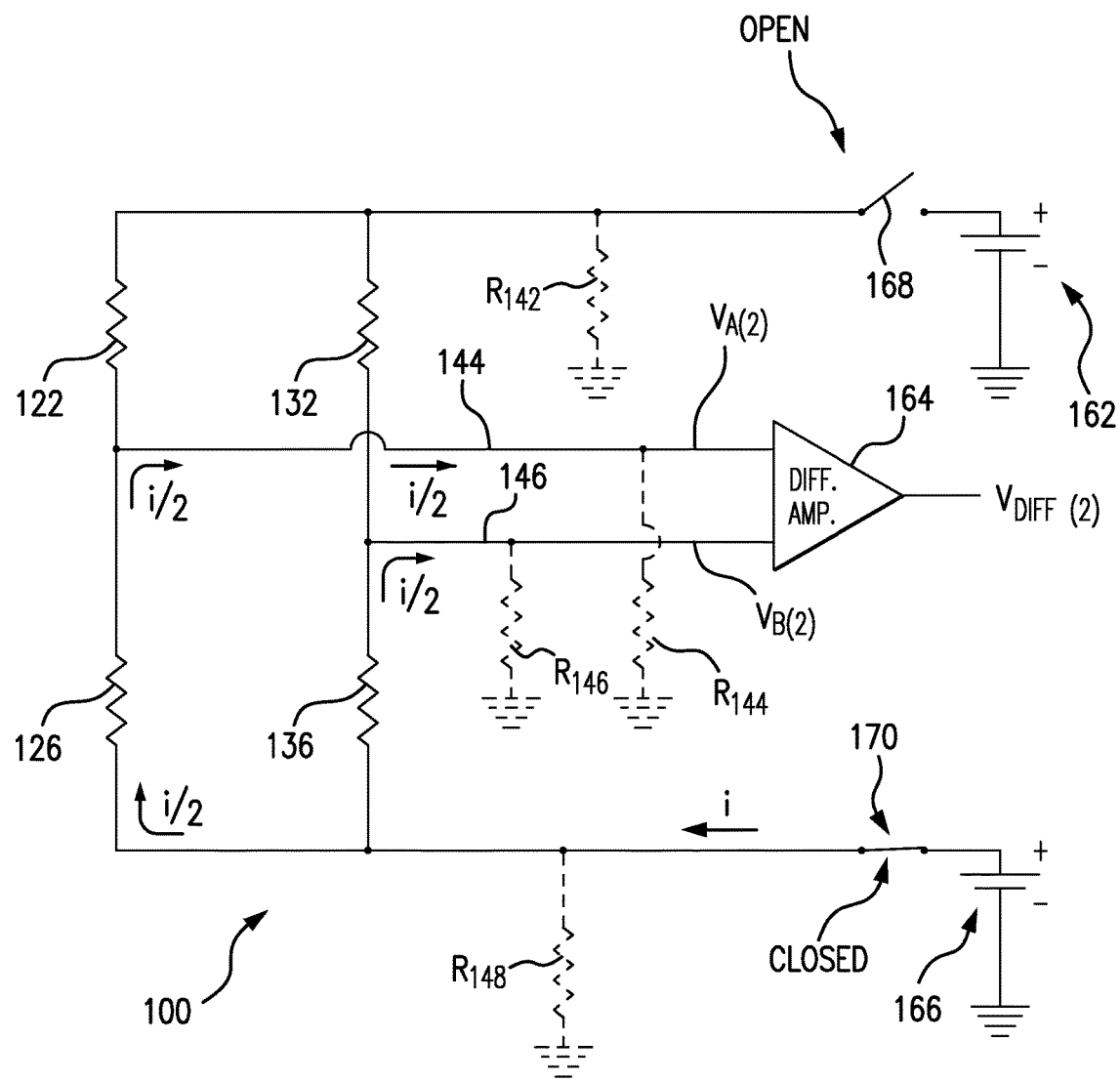
FIG. 3 is a circuit diagram of the sensor interface circuit of FIG. 1, showing the circuit in a second configuration wherein a second voltage source is connected to the bridge sensor.

With reference to FIG. 3, sensor interface circuit 100 is shown in a second configuration. In the second configuration, first switch 168 is electrically open and second switch 170 is electrically closed. This causes current to flow through second input lead 148, third resistor 132, fourth resistor 136, first output lead 144, and second output lead 146. As with the first configuration, when first output lead current leakage path $R_{144}$ and second output lead current leakage path $R_{146}$ are zero or equivalent to one another, voltage $V_{A(1)}$ and $V_{B(1)}$ will be equivalent, and a differential voltage measurement $V_{Diff(1)}$ reported by differential voltage measurement module 164 will be zero. Similarly, if that first output lead current leakage path $R_{144}$ and second output lead current leakage path $R_{146}$ are unequal to one another, voltage $V_{A(1)}$ and $V_{B(1)}$ should be unequal. Specifically, differential voltage measurement $V_{Diff(2)}$ reported by differential voltage measurement module 164 should be about the same as differential voltage measurement $V_{Diff(1)}$ to be non-zero.

In the event that differential voltage measurement $V_{Diff(2)}$ is not equivalent to voltage differential measurement $V_{Diff(1)}$, then at least one of first input lead current leakage path $R_{142}$ and second input lead current leakage path $R_{148}$ is non-zero. For example, if there is current leakage through second input lead current leakage path $R_{148}$ while first switch 168 is closed and second switch 170 is open, second input lead current leakage path $R_{148}$ forms a leg of a voltage divider circuit. This causes differential voltage measurement $V_{Diff(1)}$ to be unequal to $V_{Diff(2)}$. Similarly, if there is current leakage through first input lead current leakage path $R_{142}$ while second switch 170 is closed and first switch 168 is open, first input lead current leakage path $R_{142}$ forms a leg of a voltage divider circuit. This likewise causes differential voltage measurement $V_{Diff(2)}$ to be unequal to $V_{Diff(1)}$. Under these circumstances, location and magnitude current leakage from the input leads can be determined by comparing an output of differential voltage measurement module 164 when both first switch 168 and second switch 170 to either differential voltage measurement $V_{Diff(1)}$ and voltage differential measurement $V_{Diff(2)}$.

Figure 4:
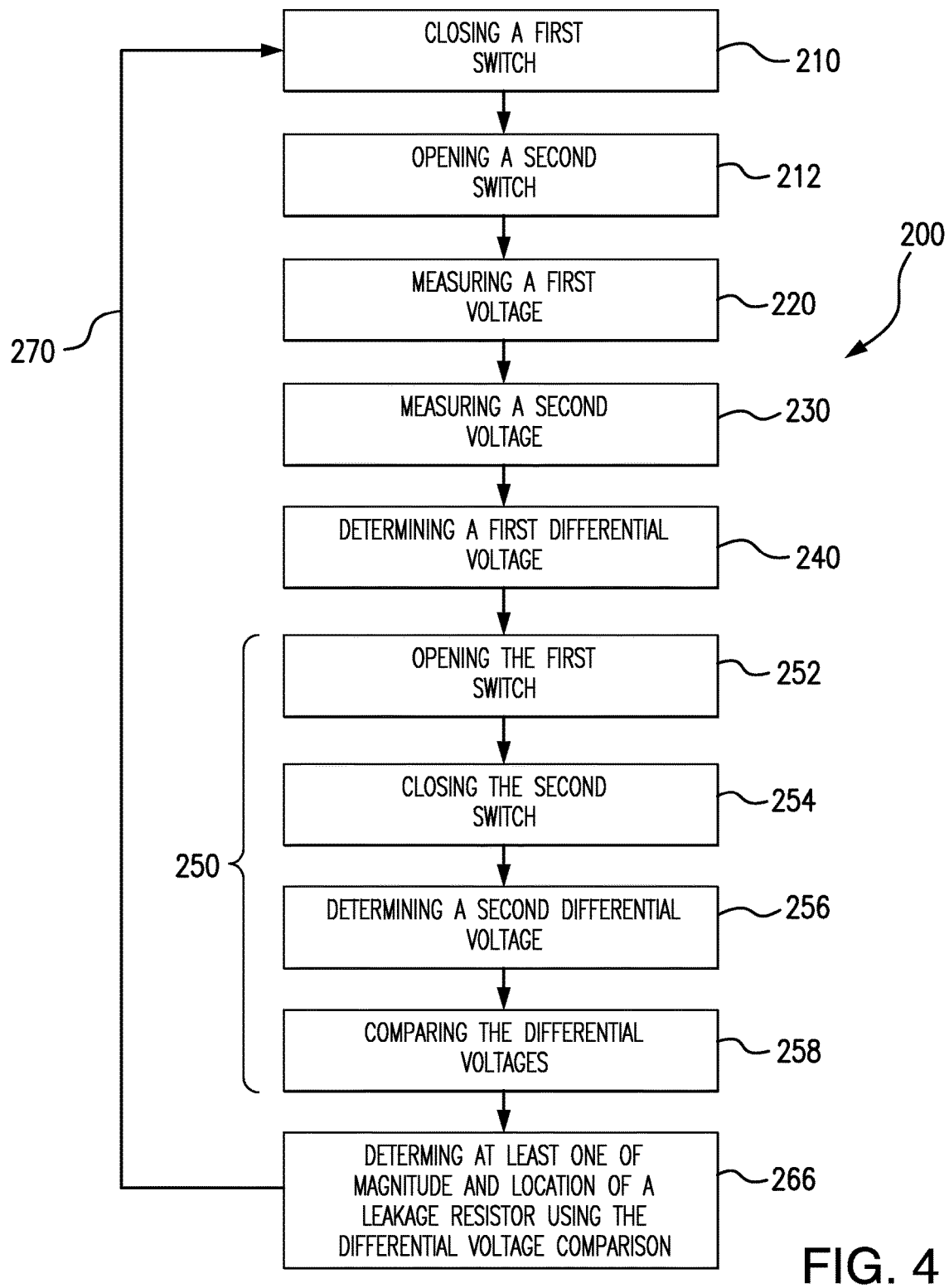
FIG. 4 is a method of detecting current leakage attributable to current leakage from leads connected to the bridge sensor of FIG. 1, showing operations for quantifying and locating current leakages from input and output leads within the cable.

With reference to FIG. 4, a method 200 of detecting current leakage within a sensor interface circuit, e.g. bridge sensor 110 (shown in FIG. 1), is shown. Method 200 includes a step 210 for connecting a first voltage source, e.g. first voltage source 162 (shown in FIG. 1) to a first input terminal of the bridge sensor, e.g. first input terminal 112 (shown in FIG. 1). Connecting the first voltage source to the first input terminal can include closing the first switch connected between the first voltage source and the first input terminal.

Method 200 also includes a step 220 for determining voltage at a first measurement terminal of a first output lead connected to a first resistive branch of the bridge sensor, e.g. first output lead 144 (shown in FIG. 1), and a step 230 for determining voltage at a second measurement terminal of a second output lead connected to a second resistive branch of the bridge sensor, e.g. second output lead 146 (shown in FIG. 1). Method 200 additionally includes a step 232 for calculating a first differential between the determined voltages, a step 234 for quantifying leakage current flow from one of the first and second output leads using the calculated voltage differential, and a step 236 for determining a location of the leakage current flow from one of the first and second output leads using the first differential voltage.

In embodiments, method 200 includes a step 240 for connecting a second voltage source, e.g. second voltage source 166 (shown in FIG. 1) to a second input terminal, e.g. second input terminal 114 (shown in FIG. 1) of the bridge sensor, a step 242 for determining again voltages at the first and second measurement terminals, a step 244 for calculating a second differential between the determined voltages, and a step 246 for quantifying leakage current from an input lead, e.g. second input lead 148 (shown in FIG. 1), for connecting the second voltage source to the bridge sensor second input terminal. Connecting the second voltage source to the second input terminal can include closing a second switch, e.g. second switch 170 (shown in FIG. 1), connected between the second voltage source and the second input terminal of the bridge sensor. It is also contemplated that the method can include a step 248 for disconnecting the first voltage source and a step 250 for quantifying leakage current from an input lead connected between the first switch and the first input terminal. As indicated by reference numeral 270, method 200 can be iteratively repeated to monitor measurement accuracy over time.

Conventional bridge-type sensors can be susceptible to high impedance leakage due to the common mode voltage created at the sensor outputs. As the sensor output is not typically a low impedance source, this can cause error in measurements acquired using the sensor as the sensor output can be degraded by the unintended leakage path. Embodiments of sensor interface circuits described herein allow evaluating differential leakage between the sensor outputs. Determining differential leakage between the sensor outputs allows for determining relative magnitude of the leakages. Once determined, sensor output can be adjusted in view of the relative magnitudes of the leakages, thereby compensating for potentially degraded measurement system performance and avoiding measurement inaccuracy.

The methods and systems of the present disclosure, as described above and shown in the drawings, provide for bridge sensor interface circuits with superior properties including increased accuracy. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A sensor interface circuit, comprising:
   first and second input terminals;
   a resistive bridge circuit including a pair of parallel resistive branches connected between the first and second input terminals, both resistive branches including an output terminal disposed between serially arranged resistors of the resistive branches;
   a first switch connected to the first input terminal and in series with the resistive branches for connecting a first voltage source to both resistive branch output terminals;
   a second switch connected to the second input terminal and in series with the resistive branches for connecting a second voltage source to both resistive branch output terminals;
   a first voltage source connected to the first input terminal through the first switch;
   a second voltage source connected to the second input terminal through the first switch; and
   a voltage differential measurement module connected to the resistive branch output terminals
   wherein the sensor interface circuit has a first configuration and a second configuration, the first switch being closed and the second switch being open in the first configuration, the first switch being open and the second switch being closed in the second configuration,
   wherein the differential measurement module is compare a differential voltage measurement acquired in the first configuration with a differential measurement acquired in the second configuration to determine at least one of magnitude and leakage in the circuit.

2. A circuit as recited in claim 1, further including an output lead connected between an output of the first resistive branch and the voltage differential measurement module.

3. A circuit as recited in claim 2, further including an input lead connecting the switch to the voltage differential measurement module through the output lead.

4. A method of detecting current leakage within a sensor interface circuit, comprising:
   connecting a first voltage source to a first input terminal of a bridge sensor;
   determining voltage at a first output terminal of a first output lead connected to a first resistive branch of the bridge sensor;
   determining voltage at a second output terminal of a second output lead connected to a second resistive branch of the bridge sensor;
   calculating a first differential between the determined voltages;
   disconnecting the first voltage source from the first input terminal of the bridge sensor;
   connecting a second voltage source to a second input terminal of the bridge sensor;
   determining voltage at the first output terminal of the first lead connected to the first resistive branch of the bridge sensor;
   determining voltage at the second output terminal of the second lead connected to the second resistive branch of the bridge sensor;
   calculating a second differential between the determined voltages;
   comparing the second differential with the first differential;
   determining at least one of magnitude and location of a leakage resistor using comparison the second differential and first differential.

5. A method as recited in claim 4, further including quantifying leakage current flow from one of the first and second output leads using the calculated first differential or second differential.

6. A method as recited in claim 4, further including determining a location of the leakage current flow from one of the first and second output leads using the first differential.

7. A method as recited in claim 4, wherein connecting the first voltage source to the first input terminal includes closing a first switch connected between the first voltage source and the first input terminal of the bridge sensor.

8. A method as recited in claim 4, wherein connecting the second voltage source to the second input terminal includes closing a second switch connected between the second voltage source and the second input terminal of the bridge sensor.

9. A method as recited in claim 8, further including:
   disconnecting the first voltage source; and
   quantifying leakage current from an input lead connected between the first switch and the first input terminal.

* * * * *